US012740342B2

(12) United States Patent
Tortorelli et al.

(10) Patent No.: US 12,740,342 B2
(45) **Date of Patent: *Sep. 15, 2026**

(54) RANDOM NUMBER GENERATION BASED ON THRESHOLD VOLTAGE RANDOMNESS

(71) Applicant: Micron Technology, Inc., Boise, ID (US)

(72) Inventors: Innocenzo Tortorelli, Cernusco sul Naviglio (IT); Matteo Impalà, Milan (IT); Cécile Colette Solange Nail, Meylan (FR)

(73) Assignee: Micron Technology, Inc., Boise, ID (US)

( * ) Notice: Subject to any disclaimer, the term of this patent is extended or adjusted under 35 U.S.C. 154(b) by 121 days.

This patent is subject to a terminal disclaimer.

(21) Appl. No.: 18/782,436

(22) Filed: Jul. 24, 2024

(65) Prior Publication Data

US 2025/0024761 A1 Jan. 16, 2025

Related U.S. Application Data

(63) Continuation of application No. 17/818,617, filed on Aug. 9, 2022, now Pat. No. 12,075,714.

(51) Int. Cl.
*H10N 70/00* (2023.01)
*G11C 13/00* (2006.01)

(52) U.S. Cl.
CPC ......... *H10N 70/882* (2023.02); *G11C 13/003* (2013.01); *H10N 70/826* (2023.02)

(58) Field of Classification Search
CPC .. H10N 70/882; H10N 70/826; G11C 13/003; G11C 13/004; G11C 13/0061; G11C 13/0004; G11C 16/34; G06F 7/588
(Continued)

(56) References Cited

U.S. PATENT DOCUMENTS 7,688,124 B2 3/2010 Choi
8,830,741 B1 9/2014 Willey et al.
(Continued)

FOREIGN PATENT DOCUMENTS

CN 1813361 A 8/2006
CN 111465987 A 7/2020
(Continued)

OTHER PUBLICATIONS

Balatti, S., et al., "True random No. generation by variability of resistive switching in oxide-based devices.", IEEE Journal on Emerging and Selected Topics in Circuits and Systems, vol. 5, Issue. 2, 2015, pp. 214-221.
(Continued)

*Primary Examiner* — Fernando Hidalgo
(74) *Attorney, Agent, or Firm* — Holland & Hart LLP

(57) ABSTRACT

Methods, systems, and devices for random number generation based on threshold voltage randomness are described. For example, a memory device may apply a voltage to a chalcogenide element and increase the applied voltage at least until the applied voltage satisfies a threshold voltage associated with the chalcogenide element. The memory device may detect the state of an oscillating signal at a time at which the applied voltage satisfies the threshold voltage, and the memory device may output a logic value corresponding to the state of the oscillating signal. The threshold voltage of the chalcogenide element may vary in a statistically random manner across voltage applications, and hence the state of the oscillating signal at the time an applied voltage reaches the threshold voltage may likewise vary in a statistically random manner, and thus the corresponding logic value that is output may be a random value suitable for random number generation.

20 Claims, 8 Drawing Sheets

(58) Field of Classification Search
USPC .......................................................... 365/129
See application file for complete search history.

(56) References Cited

U.S. PATENT DOCUMENTS

| | | | | |
|---|---|---|---|---|
| 2004/0178403 | A1 | 9/2004 | Ovshinsky | |
| 2007/0133267 | A1 * | 6/2007 | Cho | G11C 13/0069 365/163 |
| 2009/0302303 | A1 | 12/2009 | Lowrey | |
| 2010/0165722 | A1 | 7/2010 | Sheu et al. | |
| 2011/0235459 | A1 | 9/2011 | Ware et al. | |
| 2012/0287730 | A1 | 11/2012 | Kim | |
| 2017/0153872 | A1 | 6/2017 | Le Gallo et al. | |
| 2019/0042201 | A1 | 2/2019 | Ielmini et al. | |
| 2019/0189203 | A1 | 6/2019 | Redaelli et al. | |
| 2021/0358546 | A1 | 11/2021 | Sinipete et al. | |
| 2023/0170020 | A1 | 6/2023 | Song | |

FOREIGN PATENT DOCUMENTS

| | | | | |
|---|---|---|---|---|
| CN | 113434114 | A | 9/2021 | |
| KR | 100699872 | B1 * | 3/2007 | G11C 8/08 |
| TW | 201638942 | A * | 11/2016 | G11C 13/0064 |
| WO | 2010/004646 | A1 | 1/2010 | |

OTHER PUBLICATIONS

Chinese patent office, “China Office Action,” issued in connection with China Patent Application No. 202310996974.9 dated Jan. 4, 2025 (12 pages) (5 pages of English Translation and 7 pages of Original Document).

* cited by examiner

400

RANDOM NUMBER GENERATION BASED ON THRESHOLD VOLTAGE RANDOMNESS

CROSS REFERENCE

The present application for patent is a continuation of U.S. patent application Ser. No. 17/818,617 by Tortorelli et al., entitled "RANDOM NUMBER GENERATION BASED ON THRESHOLD VOLTAGE RANDOMNESS," filed Aug. 9, 2022, assigned to the assignee hereof, and is expressly incorporated by reference in its entirety herein.

FIELD OF TECHNOLOGY

The following relates to one or more systems for memory, including random number generation based on threshold voltage randomness.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
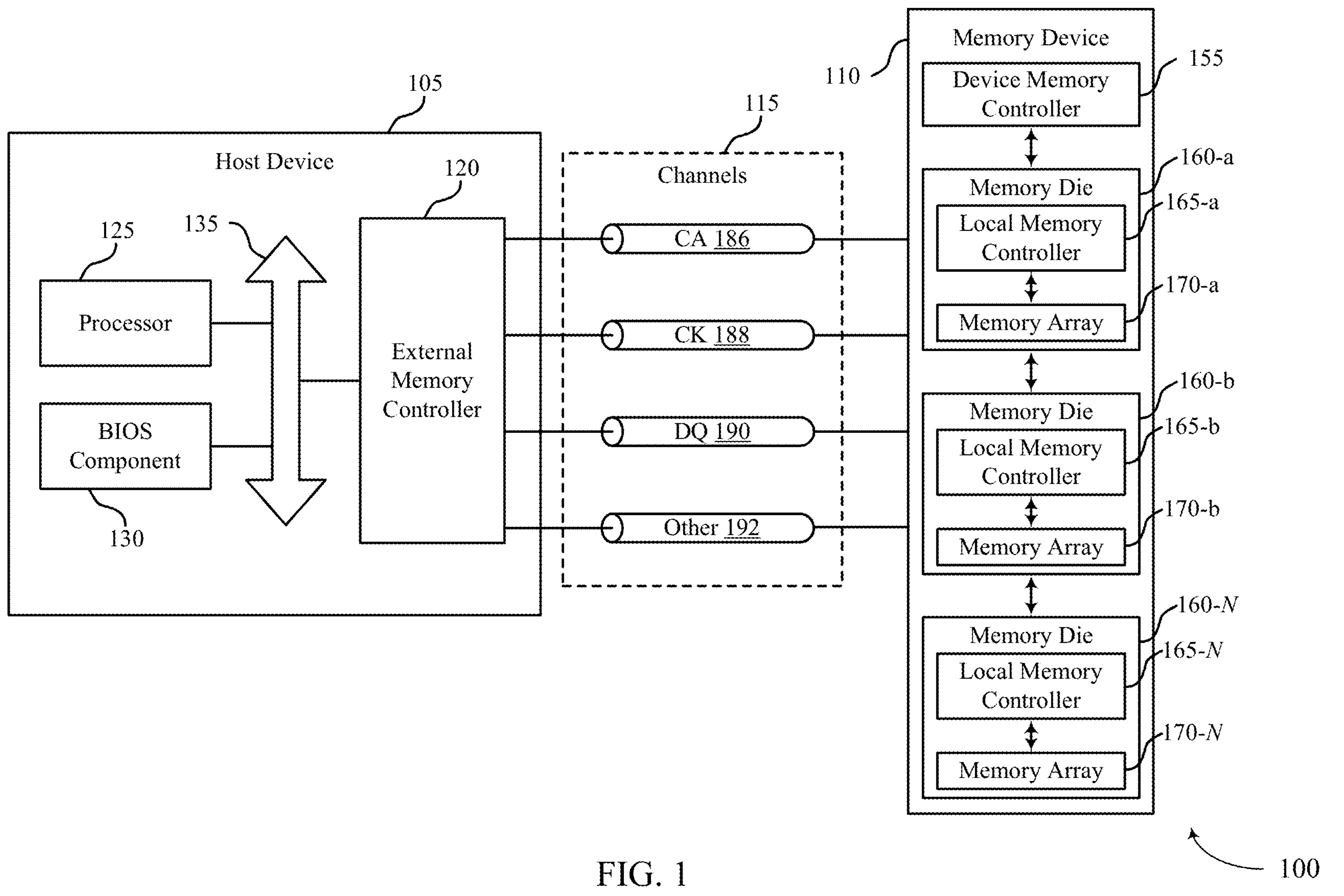
FIG. 1 illustrates an example of a system that supports random number generation based on threshold voltage randomness in accordance with examples as disclosed herein.

Random numbers may be produced by a memory device or a host device to aid in a variety of applications, including but not limited to cryptography, simulating and modeling complex systems, or for selecting random samples from data sets. For example, random numbers may be useful for generating cryptographic keys for accessing (e.g., decoding) encrypted data. In some cases, an algorithm or a set of logical procedures may generate random numbers, such that generating the random numbers may be associated with latency or resource consumption (e.g., processing bandwidth) at the memory device or the host device or both. It may be desirable to generate random numbers using hardware of the memory device to conserve resource consumption, reduce associated lately, or to achieve other potential benefits.

A memory device may include one or more chalcogenide elements. As used herein, a chalcogenide element may refer to any portion (e.g., chunk, piece, mass) of chalcogenide material. For example, in some memory devices, memory cells may each include a chalcogenide element. In some cases, a chalcogenide element may become conductive once a voltage applied to the chalcogenide element satisfies a threshold voltage. For example, when an applied voltage across the chalcogenide element is below the threshold voltage, the chalcogenide element may exhibit a relatively high resistance (low conductivity), and when the applied voltage is above the threshold voltage, the chalcogenide element may exhibit a relatively low resistance (high conductivity). The difference between the two resistances may be sufficiently large that the chalcogenide element may be considered non-conductive when the applied voltage is below the threshold voltage and may be considered conductive when the applied voltage is above the threshold voltage. In some cases, when the applied voltage reaches the threshold voltage (e.g., is increased to a magnitude equal to the threshold voltage, after having been below the threshold voltage), a current through the chalcogenide element may increase (e.g., spike) in a detectable manner, which in some cases may be referred to as the chalcogenide element "snapping." Thus, as used herein, a chalcogenide element snapping may refer to a voltage across the chalcogenide reaching the threshold voltage of the chalcogenide element, or any related phenomenon (e.g., an associated current spike). Hence the snapping of a chalcogenide element may be detected by detecting an associated decrease in resistance or increase in current, among other possibilities.

The threshold voltage of a chalcogenide element may be stochastic in nature, such that the threshold voltage of the chalcogenide element may vary in a random (e.g., statistically random) manner from one voltage application to the next, within a range of statistically expected values (which may be referred to as an expected range). That is, a first voltage may be applied to a chalcogenide element and increased until the chalcogenide element snaps a first time, a second voltage may thereafter be applied to the chalcogenide element and increased until the chalcogenide element snaps a second time, and the two snaps may occur at different (e.g., slightly different) voltages due to random variation of the threshold voltage of the chalcogenide element. Thus, for example, a voltage applied to the chalcogenide element may satisfy the threshold voltage at a random voltage in an expected threshold voltage interval (e.g., within a range of statistically expected values for the threshold voltage), and the chalcogenide element may become conductive (e.g., snap) at a statistically random voltage.

In accordance with examples as disclosed herein, random numbers may be generated by a memory device using a stochastic threshold voltage associated with a chalcogenide element. For example, the memory device may include a voltage source configured to apply a voltage to the chalcogenide element and increase the voltage at least until the threshold voltage is satisfied. The memory device may include a signal generator configured to generate an oscillating signal, where the oscillating signal may alternate between two states (e.g., a high state and a low state). The oscillating signal may alternate many times concurrently with increasing the voltage applied to the chalcogenide element (e.g., with a high frequency, relative to a ramp rate at which the applied voltage is increased), such that the state of the oscillating signal may change many times during the expected threshold voltage interval (e.g., the statistically expected range of the threshold voltage). In this way, the state of the oscillating signal (e.g., whether it is high or low) as of when the chalcogenide element snaps may be unpredictable and vary in a random manner consistent with the random variation of the threshold voltage of the chalcogenide element.

The memory device may include a latch configured to detect the state of the oscillating signal as of a time the threshold voltage of the chalcogenide element is satisfied by the applied voltage, where such time may be subject to a degree of random variation as explained herein. For example, the latch may detect the time at which the threshold voltage of the chalcogenide element is satisfied by the applied voltage based on sensing when the magnitude of a current through or otherwise associated with the chalcogenide element crosses a threshold (or based on detecting some other event associated with the chalcogenide element snapping), and the latch may determine (e.g., sample) the value of the oscillating signal as of that time (e.g., detect whether, at the time of the snapping, the oscillating signal is in a high state, a low state, or some other detectable state). The latch may output a logic value (e.g., a 0 or a 1) that corresponds to (e.g., is indicative or representative of), which may be a random logic value (e.g., 0 or 1) due to the random variation of the threshold voltage and correspondingly of the time at which the state of the oscillating signal is detected. Generating random numbers using hardware components of the memory device and the method described herein may relieve resource allocation (e.g., processing bandwidth) and decrease latency associated with generating random numbers using other means, among other potential benefits. Further, the memory device described herein may use chalcogenide elements already implemented in the memory architecture, thereby the chalcogenide elements may support random number generation without additional cell programming or preconditioning.

Features of the disclosure are initially described in the context of memory systems, dies, and arrays as described with reference to FIGS. 1-3. Features of the disclosure are described in the context of random number generator diagrams as described with reference to FIGS. 4, 5A, 5B, and 5C. These and other features of the disclosure are further illustrated by and described with reference to an apparatus diagram and flowcharts that relate to random number generation based on threshold voltage randomness as described with references to FIGS. 6 through 7.

FIG. 1 illustrates an example of a system 100 that supports random number generation based on threshold voltage randomness in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In accordance with examples as disclosed herein, random numbers may be generated by the memory device 110 using a stochastic threshold voltage associated with a chalcogenide element (e.g., memory cell). For example, the memory device 110 may include a voltage source configured to apply a voltage to the chalcogenide element and increase the voltage until the threshold voltage is satisfied (e.g., until after a snap of the chalcogenide element is detected, or until the applied voltage is beyond an expected range associated with the threshold voltage). The memory device 110 may include a signal generator configured to generate an oscillating signal, where the oscillating signal may alternate between two or more states (e.g., a high state and a low state). The oscillating signal may change states (e.g., alternate) many times concurrently with the memory device 110 increasing the voltage applied to the chalcogenide element, such that the state may change many times during a time period in which a magnitude of the applied voltage is within the expected threshold voltage interval of the chalcogenide element. The memory device 110 may include a latch configured to detect the state of the oscillating signal at a time the threshold voltage of the chalcogenide element is satisfied. The latch may output the state of the oscillating signal as a random logic value (e.g., 0 or 1) at the time the threshold voltage is satisfied. Generating random numbers using the components of the memory device 110 and the method described herein may relieve resource allocation (e.g., processing bandwidth) and decrease latency associated with generating random numbers using other means. Further, the memory device 110 described herein may use chalcogenide elements already implemented in the memory architecture, thereby the chalcogenide elements may support random number generation without additional cell programming or preconditioning.

Figure 2:
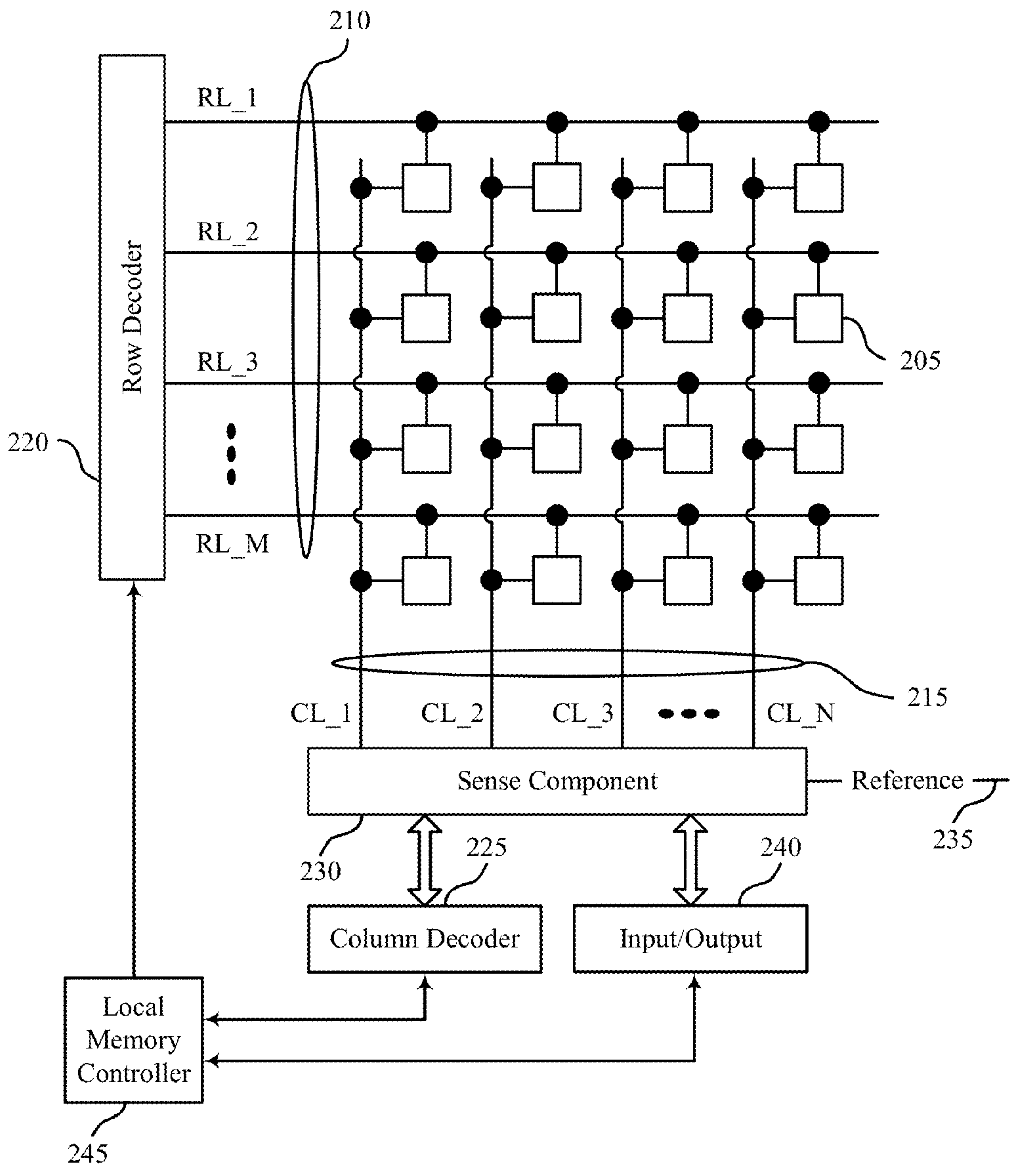
FIG. 2 illustrates an example of a memory die that supports random number generation based on threshold voltage randomness in accordance with examples as disclosed herein.

FIG. 2 illustrates an example of a memory die 200 that supports random number generation based on threshold voltage randomness in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200. In some cases, the sense component 230 may be an example of a latch component described herein.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

In accordance with examples as disclosed herein, random numbers may be generated by a memory device using a stochastic threshold voltage associated with a chalcogenide element (e.g., memory cell 205). For example, the memory device may include a voltage source configured to apply a voltage to the chalcogenide element and increase the voltage until the threshold voltage is satisfied. The memory device may include a signal generator configured to generate an oscillating signal, where the oscillating signal may alternate between two states (e.g., a high state and a low state). The oscillating signal may alternate or otherwise change state many times concurrently with the voltage applied to the chalcogenide element being increased, such that the state may change many times during the expected threshold voltage interval. The memory device may include a latch configured to detect the state of the oscillating signal at a time the threshold voltage of the chalcogenide element is satisfied. The latch may output the state of the oscillating signal as a random logic value (e.g., 0 or 1) at the time the threshold voltage is satisfied. Generating random numbers using the components of the memory device and the method described herein may relieve resource allocation (e.g., processing bandwidth) and decrease latency associated with generating random numbers using other means. Further, the memory device described herein may use chalcogenide elements already implemented in the memory architecture, thereby the chalcogenide elements may support random number generation without additional cell programming or preconditioning.

Figure 3:
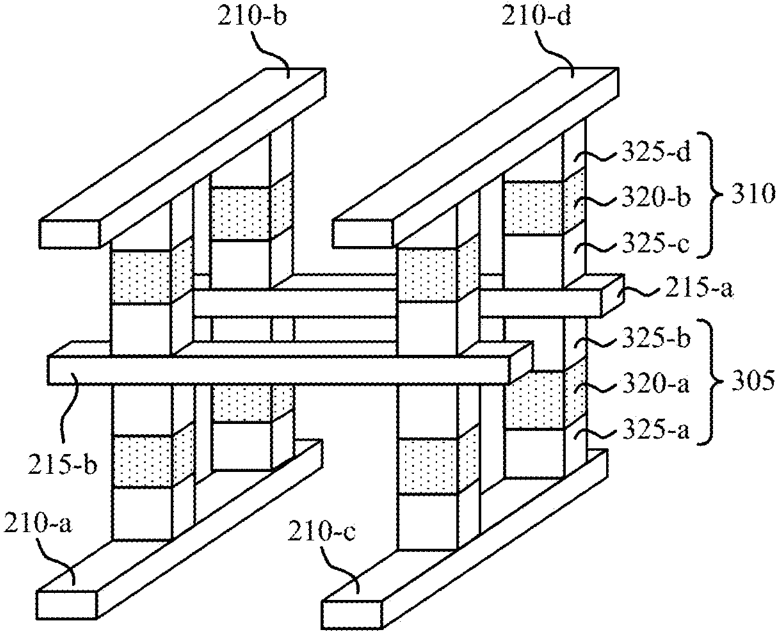
FIG. 3 illustrates an example of memory cells that support random number generation based on threshold voltage randomness in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-*a*, a row line 210-*b*, a row line 210-*c*, a row line 210-*d*, a column line 215-*a*, and a column line 215-*b*, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-*a*, a storage element 320-*a*, or an electrode 325-*b*. One or more memory cells of the second deck 310 may include an electrode 325-*c*, a storage element 320-*b*, and an electrode 325-*d*. The storage elements 320 may be examples of a chalcogenide material, such as a phase change storage element, a thresholding storage element, or a self-selecting storage element. The storage elements 320 may be examples of chalcogenide elements as described herein. The memory cells of the first deck 305 and second deck 310 may, in some examples, have common conductive lines such that corresponding memory cells of one or more decks 305 and one or more decks 310 may share column lines 215 or row lines 210. For example, the first electrode 325-*c* of the second deck 310 and the second electrode 325-*b* of the first deck 305 may be coupled with column line 215-*a* such that the column line 215-*a* may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-*a*, storage element 320-*a*, electrode 325-*b*), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320.

In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state).

During a programming (write) operation of a self-selecting memory cell (e.g., including electrode 325-*a*, storage element 320-*a*, and electrode 325-*b*), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but may not be in a pillar or stack configuration).

In accordance with examples as disclosed herein, random numbers may be generated by a memory device using a stochastic threshold voltage associated with a chalcogenide element (e.g., storage element 320). The storage element 320 may be an example of the chalcogenide element possessing a stochastic threshold voltage and may be used for random number generation. For example, the memory device may include a voltage source configured to apply a voltage to the chalcogenide element and increase the voltage until the threshold voltage is satisfied. The memory device may include a signal generator configured to generate an oscillating signal, where the oscillating signal may alternate between two states (e.g., a high state and a low state). The oscillating signal may alternate many times concurrently with the memory device increasing the voltage applied to the chalcogenide element, such that the state may change many times during a period in which a magnitude of the applied voltage is within the expected threshold voltage interval associated with the storage element 320. The memory device may include a latch configured to detect the state of the oscillating signal at a time the threshold voltage of the chalcogenide element is satisfied. The latch may output the state of the oscillating signal as a random logic value (e.g., 0 or 1) at the time the threshold voltage is satisfied. Generating random numbers using the components of the memory device and the method described herein may relieve resource allocation (e.g., processing bandwidth) and decrease latency associated with generating random numbers using other means. Further, the memory device described herein may use chalcogenide elements already implemented in the memory architecture, thereby the chalcogenide elements may support random number generation without additional cell programming or preconditioning.

Figure 4:
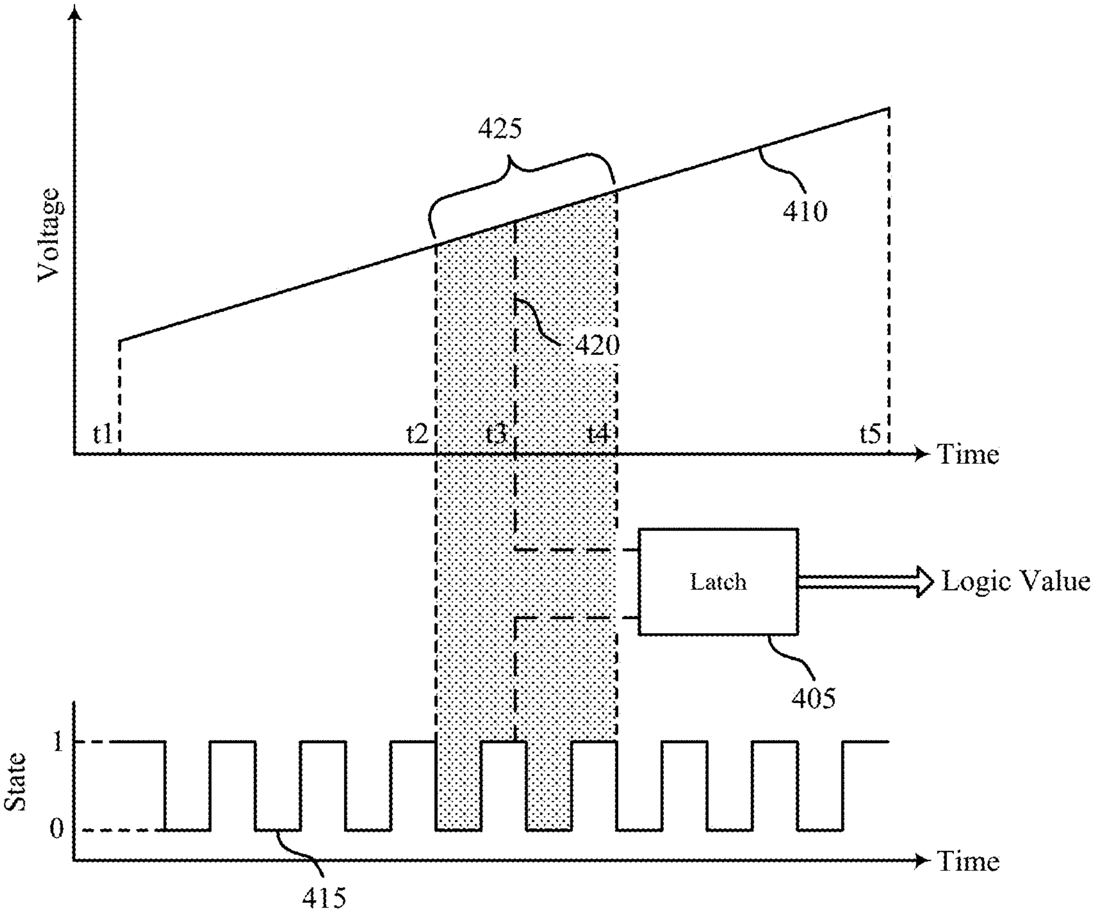
FIG. 4 illustrates an example of a random number generator diagram that supports random number generation based on threshold voltage randomness in accordance with examples as disclosed herein.

FIG. 4 illustrates an example of a random number generator diagram 400 that supports random number generation based on threshold voltage randomness in accordance with examples as disclosed herein. The random number generator diagram 400 may be implemented by system 100 as described with reference to FIG. 1. Similarly, the random number generator diagram 400 may include aspects or components of the system 100, the memory die 200, or the memory array 300, as described with reference to FIGS. 1, 2, and 3, respectively. Aspects or components of the random number generator diagram 400 may be omitted from FIG. 4 for illustrative clarity. The random number generator diagram 400 may describe operations at a memory device implementing a chalcogenide element with a random threshold voltage for use in random number generation.

The random number generator diagram 400 may describe a method at a memory device which includes a chalcogenide element (e.g., not shown), a voltage source (e.g., not shown), a signal generator (e.g., not shown), and a latch 405. The chalcogenide element may be a piece of chalcogenide material such as storage element 320, as described with reference to FIG. 3. The voltage source may be configured to apply a voltage 410 to the chalcogenide element, where the voltage source increases the voltage 410 with respect to time. In some cases, a memory device controller may include or control the voltage source. The signal generator may be configured to generate an oscillating signal 415, where the oscillating signal 415 may alternate between two states (e.g., high and low, high and intermediate, intermediate and low, 1 and 0, among other examples) over time. The latch 405 may be coupled with the chalcogenide element and the oscillating signal 415, and the latch 405 may monitor the voltage 410 or current or both at the chalcogenide element and the oscillating signal 415.

At t1, the voltage source may apply a voltage 410 (e.g., a read voltage) to the chalcogenide element. The voltage source may subsequently increase the voltage 410 applied to the chalcogenide element. For example, the voltage source may initially apply the voltage 410 of 4V at t1 and increase the voltage 410 to 5V at a constant rate within a duration to t5.

The chalcogenide element may have a random (e.g., stochastic) threshold voltage 420. The threshold voltage 420 may be based on one or more physical characteristics of the chalcogenide element and may indicate a voltage value at which the chalcogenide element becomes conductive (e.g., snaps). For example, when the threshold voltage 420 is satisfied, the chalcogenide element may become significantly more conductive and the latch 405 may detect a current spike from the chalcogenide element.

The threshold voltage 420 may be satisfied by a voltage value in an expected threshold voltage interval 425 (e.g., a normal quartile distribution), such that the threshold voltage 420 may have a high statistical probability of being satisfied during the expected threshold voltage interval 425. For example, the expected threshold voltage interval 425 may have a lower boundary value (e.g., 4.2V), and a higher boundary value (e.g., 4.8V), where the threshold voltage 420 is highly likely (e.g., 99% probability) to be satisfied (e.g., 4.5V) by the voltage 410. The lower boundary value may be reached by the voltage 410 corresponding to time t2, and the upper boundary value may be reached by the voltage 410 corresponding to time t4. The threshold voltage 420 may exhibit slight and random variation based on the physical characteristics of the chalcogenide element, such that a voltage at which the threshold voltage 420 is satisfied may vary between read operations (e.g., may be statistically distributed as a gaussian bounce model). In some cases, the threshold voltage 420 may be satisfied by the voltage 410 at a lower voltage value corresponding to a time closer to t2, and in other cases, the threshold voltage 420 may be satisfied by the voltage 410 at a higher voltage value corresponding to a time closer to t4.

At t3, the voltage 410 applied to the chalcogenide element may increase to the point at which the threshold voltage 420 is satisfied, where the threshold voltage 420 and hence the time t3 may vary randomly as described herein. The chalcogenide element may become conductive as of t3, and the latch 405 coupled with the chalcogenide element may detect a current spike or other associated event at t3. The latch 405 thus may detect the time, t3, at which the threshold voltage 420 is satisfied. Similarly, the latch 405 may detect the state of the oscillating signal 415 at the time, t3, when the threshold voltage 420 is satisfied. In some cases, the latch 405 may include a detection component configured to detect the time, t3, or the state of the oscillating signal 415, or both.

The oscillating signal 415 may fluctuate between two or more states (e.g., voltage states), such that the amplitude of the oscillating signal 415 may vary (e.g., alternate) between two or more voltage values. For example, the oscillating signal 415 may be a binary signal configured to alternate between a first voltage value (e.g., 1V) and a second voltage value (e.g., 0V). In some examples, the oscillating signal 415 may alternate between the first voltage value of a first polarity and the second voltage value of a second polarity (e.g., different or the same as the first polarity). The states of the oscillating signal 415 may be defined based on comparing the amplitude of the oscillating signal 415 to a threshold value. For example, if the amplitude of the oscillating signal 415 is above the threshold value, the oscillating signal 415 may be at a first state (e.g., high) or the first voltage value, and if the amplitude of the oscillating signal 415 is below the threshold value, the oscillating signal 415 may be at a second state (e.g., low) or the second voltage value. The rate at which the oscillating signal 415 alternates between the two states may be significantly faster than the rate of increase (e.g., ramp rate) for the voltage 410. For example, the oscillating signal 415 may alternate between the first state and the second state many times (e.g., thousands of times) during the expected threshold voltage interval 425, such that what state the oscillating signal 415 will be in as of t3 (when the randomly variable threshold voltage 420 is satisfied) is unpredictable and therefore exhibits random variation).

Further at or after t3, the latch 405 may output a logic value (e.g., one or more bits, which may be considered random bits) representative of the state of the oscillating signal 415 as detected at t3. Due to the oscillating signal 415 fluctuating between the two states many times during the expected threshold voltage interval 425 and the random variation of the threshold voltage 420, the state of the oscillating signal 415 as detected by the latch 405 may exhibit random variation based on the random nature of the threshold voltage 420. That is, for example, what logic value corresponds to the state of the oscillating signal 415 detected by the latch 405 may be a random logic value due to the randomness of the moment the threshold voltage 420 is satisfied and the random chance of whether the first state or the second state of the oscillating signal 415 is detected at time t3.

The voltage source may cease applying the voltage 410 in response to the threshold voltage 420 being satisfied, or at a time where the voltage 410 is sufficiently greater than the upper boundary value of the expected threshold voltage interval 425. For example, the voltage source may remove the voltage 410 from the chalcogenide element at t3, or at t5.

Using the chalcogenide element with the random threshold voltage 420 to latch 405 with the state of the oscillating signal 415, may provide advantages associated with generating a random number, such as those as described herein. In some cases, the threshold voltage 420 may remain random despite changes to other physical characteristics of the chalcogenide element. For example, the randomness of the threshold voltage 420 may not be affected by voltage drift, aging, electrical distance, or physical wear (e.g., degradation) associated with the chalcogenide element. Further, the chalcogenide element may not be configured to be reconditioned between uses for generating random numbers.

In some cases, the randomness of the method described herein may be controlled (e.g., weighted) using an unbalanced duty cycle. For example, the oscillating signal 415 may be configured by the signal generator to produce one of the two states for a longer duration during the expected threshold voltage interval 425, thereby altering a probability (e.g., weighting the probability) of one of the states being selected by the latch 405 at the time the threshold voltage 420 is satisfied. The signal generator may control the probability by altering a timing offset of the oscillating signal 415, a frequency of the oscillating signal 415, a phase of the oscillating signal 415, or any combination thereof. In some cases, by using hardware (e.g., physical components) of the memory device, rather than an algorithm to generate random numbers, a host device or a system (e.g., including the memory device) may benefit from reduced resource allocation (e.g., processing bandwidth) and decreased latency associated with random number generation.

Figure 5A:
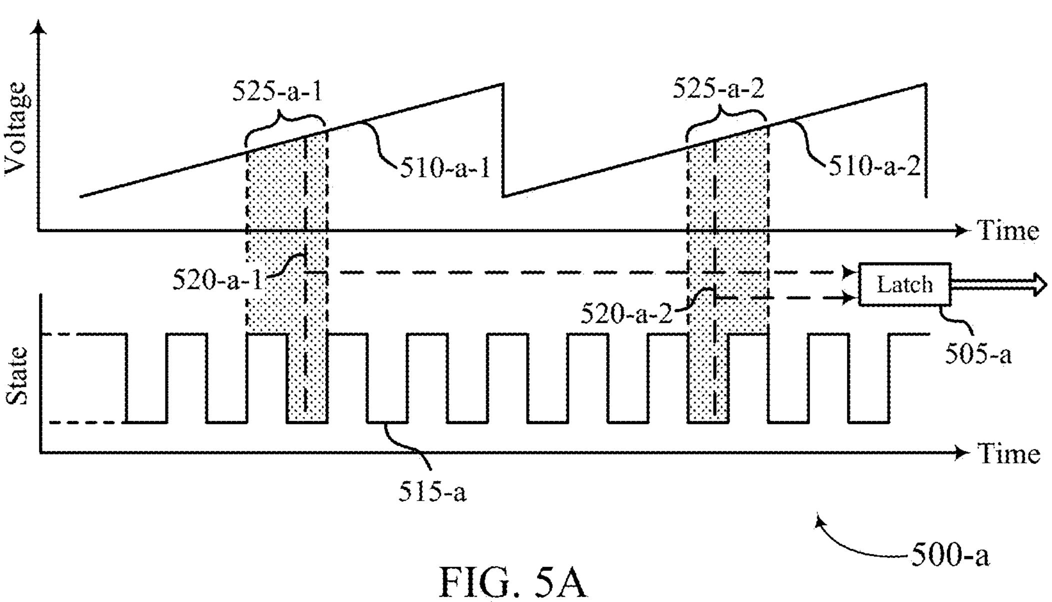
FIGS. 5A, 5B, and 5C illustrate examples of random number generator diagrams that support random number generation based on threshold voltage randomness in accordance with examples as disclosed herein.
Figure 5B:
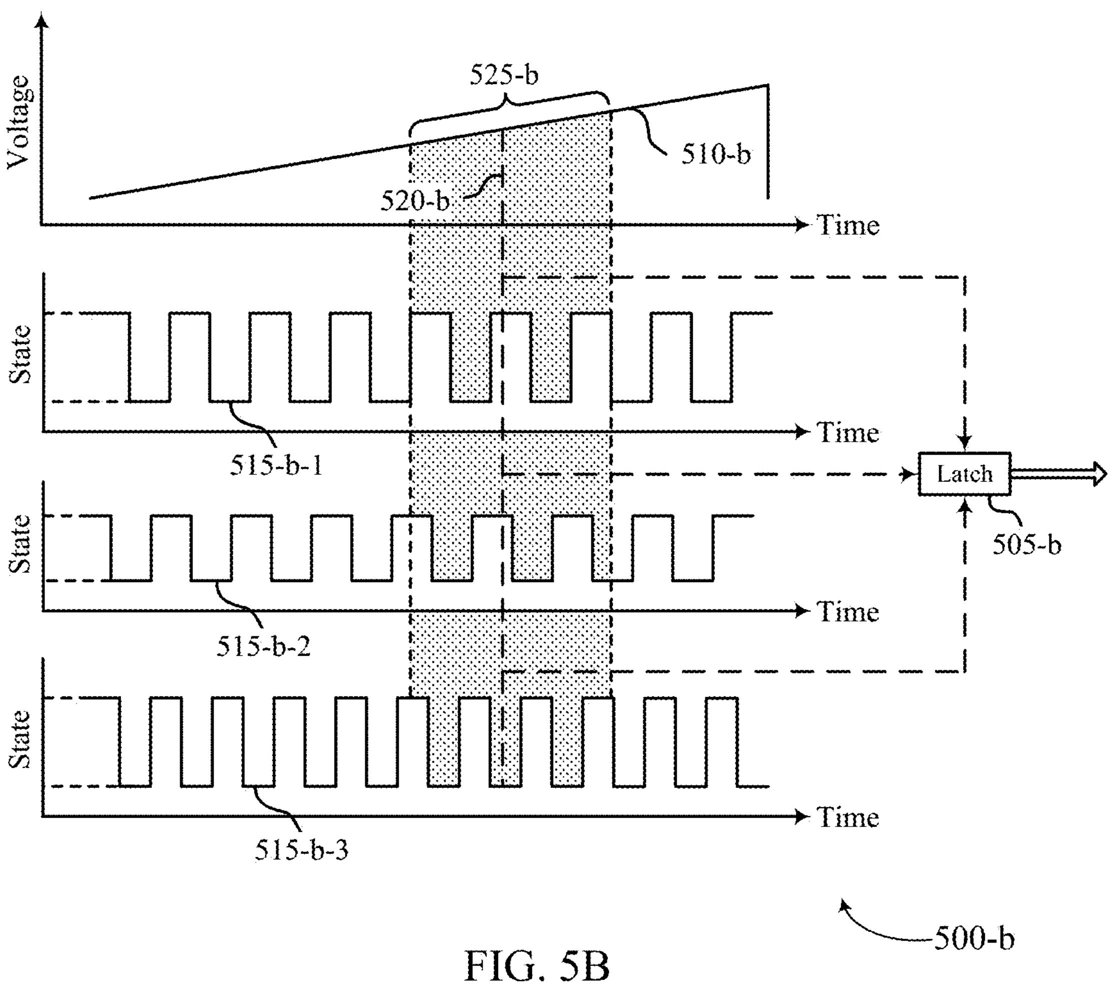
Figure 5C:
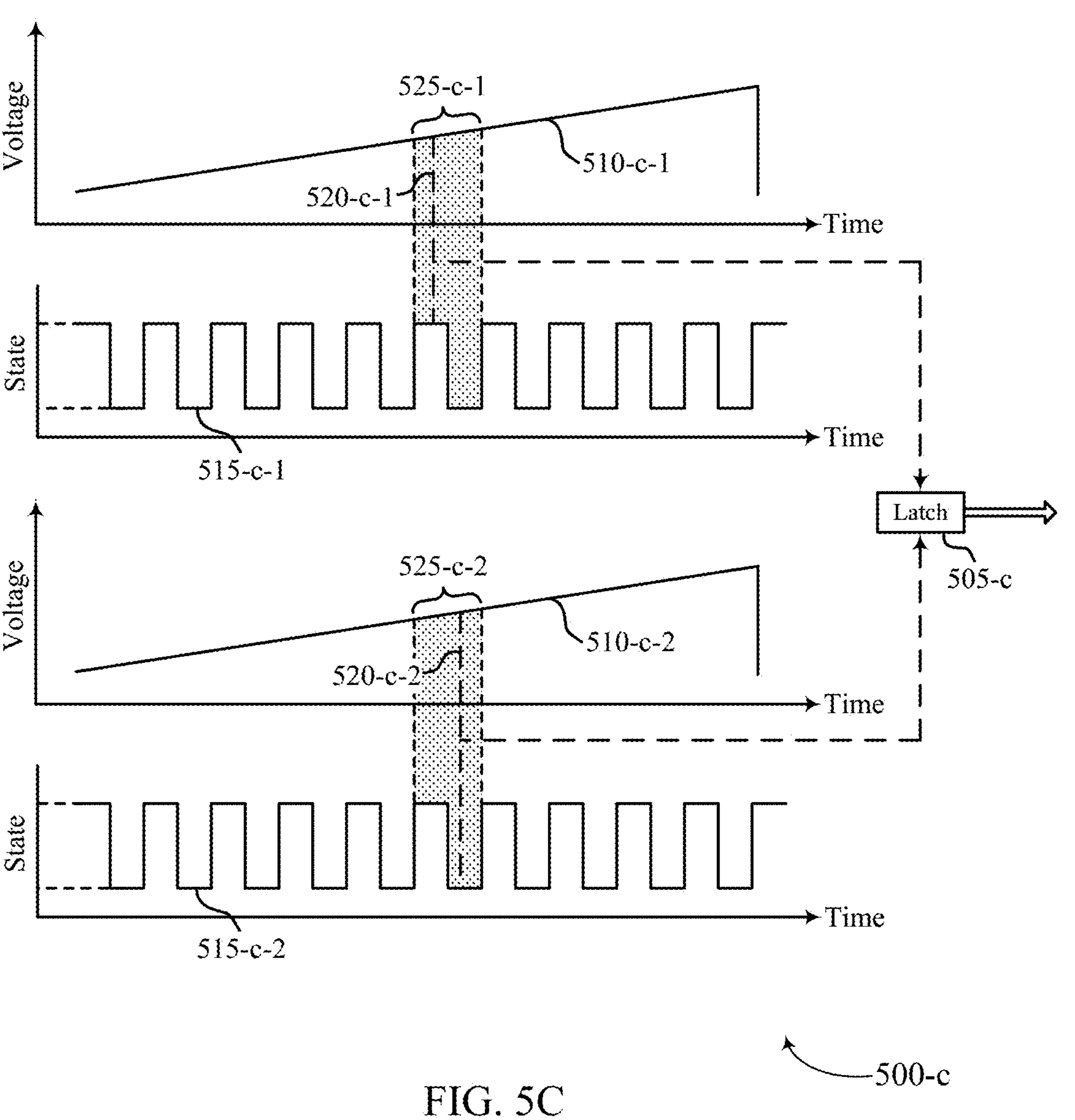

FIGS. 5A, 5B, and 5C illustrate examples of random number generator diagrams 500-*a*, 500-*b*, and 500-*c* that support random number generation based on threshold voltage randomness, respectively, in accordance with examples as disclosed herein. The random number generator diagrams 500-*a*, 500-*b*, and 500-*c* may be implemented by system 100 as described with reference to FIG. 1. Similarly, the random number generator diagrams 500-*a*, 500-*b*, and 500-*c* may include aspects or components of the system 100, the memory die 200, or the memory array 300, as described with reference to FIGS. 1, 2, and 3, respectively. The random number generator diagrams 500-*a*, 500-*b*, and 500-*c* may implement aspects of the random number generator diagram 400, such as latch 405, as described with reference to FIG. 4. Aspects or components of the random number generator diagrams 500-*a*, 500-*b*, and 500-*c* may be omitted from FIGS. 5A-5C for illustrative clarity. The random number generator diagrams 500-*a*, 500-*b*, and 500-*c* may describe operations at a memory device implementing a chalcogenide element with a random threshold voltage for use in generating multiple random numbers (e.g., random number sequences).

The random number generator diagrams 500-*a*, 500-*b*, and 500-*c* may describe variations of the random number generator diagram 400, as described with reference to FIG. 4. Each random number generator diagram 500-*a*, 500-*b*, and 500-*c* may include at least one of each of the following: a chalcogenide element (e.g., not shown), a voltage source (e.g., not shown), a signal generator (e.g., not shown), and a latch 505. The voltage source may be configured to apply at least a voltage 510 (e.g., voltage 510-*a*-1, 510-*a*-2, 510-*b*, 510-*c*-1, and 510-*c*-2) to the at least one chalcogenide element, where the voltage source increases the at least voltage 510 with respect to time. The signal generator may be configured to generate at least one oscillating signal 515 (e.g., oscillating signal 515-*a*, 515-*b*-1, 515-*b*-2, 515-*b*-3, 515-*c*-1, 515-*c*-2), where the at least one oscillating signal 515 may alternate between two states (e.g., high and low, high and intermediate, intermediate and low, 1 and 0, among other examples) over time. The latch 505 (e.g., latch 505-*a*, 505-*b*, 505-*c*) may be coupled with the at least one chalcogenide element and the at least one oscillating signal 515 and may monitor the voltage or current or both at one or more chalcogenide elements and one or more oscillating signals 515.

FIG. 5A illustrates an example of the random number generator diagram 400 implementing serial voltage applications on a single chalcogenide element to generate multiple random values, which in some cases maybe combined to form a single multi-bit random number or sequence, with each of the voltage applications as described with respect to FIG. 4. In random number generator diagram 500-*a*, the voltage source may apply a first voltage 510-*a*-1 to the chalcogenide element and increase the first voltage 510-*a*-1. At a first time after increasing the first voltage 510-*a*-1, the first voltage 510-*a*-1 may satisfy a first threshold voltage 520-*a*-1 associated with the chalcogenide element, at which time the chalcogenide element may become conductive (e.g., snap). The first threshold voltage 520-*a*-1 may be randomly satisfied at a voltage in an expected threshold voltage interval 525-*a*-1. The latch 505-*a* may detect the state of the oscillating signal 515-*a* at the first time the first threshold voltage 520-*a*-1 is satisfied and output a first logic value corresponding to the state of the oscillating signal 515-*a* at the first time. The voltage source may cease applying the first voltage 510-*a*-1 in response to the first threshold voltage 520-*a*-1 being satisfied, or at a later time when the first voltage 510-*a*-1 is sufficiently greater than an upper boundary value of the expected threshold voltage interval 525-*a*-1 and the chalcogenide element may no longer be conductive.

The voltage source may apply a second voltage 510-*a*-2 to the chalcogenide element subsequently to ceasing applying the first voltage 510-*a*-1, and the voltage source may increase the second voltage 510-*b*-2. At a second time after increasing the second voltage 510-*a*-2, the second voltage 510-*a*-2 may satisfy a second threshold voltage 520-*a*-2 associated with the chalcogenide element, at which time the chalcogenide element may become conductive again (e.g., snap). The second threshold voltage 520-*a*-2 may be different from the first threshold voltage 520-*a*-1 based on random variation associated with the chalcogenide element. Further, the second threshold voltage 520-*a*-2 may be randomly satisfied at a voltage in an expected threshold voltage interval 525-*a*-2. The latch 505-*a* may detect the state of the oscillating signal 515-*a* at the second time the second threshold voltage 520-*a*-2 is satisfied and output a second logic value (e.g., the same or different from the first logic value) corresponding to the state of the oscillating signal 515-*a* at the second time. The first logic value and the second logic value may be combined (e.g., by the latch 505-*a*) to form a random number sequence. The voltage source may cease applying the second voltage 510-*a*-2 in response to the second threshold voltage 520-*a*-2 being satisfied, or at a later time when the second voltage 510-*a*-2 is sufficiently greater than an upper boundary value of the expected threshold voltage interval 525-*a*-2. Additional voltages 510-*a* may be subsequently applied in a similar method as described above to create additional logic values for the random number sequence.

FIG. 5B illustrates an example of the random number generator diagram 400 implementing multiple oscillating signals 515-*b* (e.g., oscillating signal 515-*b*-1, 515-*b*-2, 515-*b*-3) for a single chalcogenide element to generate multiple random values, which in some cases maybe combined to form a single multi-bit random number or sequence, with each oscillating signal 515 operated on as described with respect to FIG. 4. The oscillating signals 515-*b* may be offset from one another in phase, initial timing, amplitude, frequency, or any combination thereof. Further, the oscillating signals 515-*b*-1, 515-*b*-2, and 515-*b*-3 may be three oscillating signals 515-*b* of a plurality of oscillating signals 515-*b* coupled with the latch 505-*b*. In random number generator diagram 500-*b*, the voltage source may apply a voltage 510-*b* to the chalcogenide element and increase the voltage 510-*b*. At a time after increasing the voltage 510-*b*, the voltage 510-*b* may satisfy a threshold voltage 520-*b* associated with the chalcogenide element, at which time the chalcogenide element may become conductive (e.g., snap). The threshold voltage 520-*b* may be randomly satisfied at a voltage in an expected threshold voltage interval 525-*b*. The latch 505-*b* may detect the state of oscillating signals 515-*b*-1, 515-*b*-2, and 515-*b*-3 at the time the threshold voltage 520-*b* is satisfied.

The latch 505-*b* may output a first logic value corresponding to the state of the oscillating signal 515-*b*-1 at the time the threshold voltage 520-*b* is satisfied. The latch 505-*b* may output a second logic value corresponding to the state of the oscillating signal 515-*b*-2 at the time the threshold voltage 520-*b* is satisfied. Further, the latch 505-*b* may output a third logic value corresponding to the state of the oscillating signal 515-*b*-3 at the time the threshold voltage 520-*b* is satisfied. The first logic value, the second logic value, and the third logic value may be combined (e.g., by the latch 505-*b*) to form the random number sequence. The voltage source may cease applying the voltage 510-*b* in response to the threshold voltage 520-*b* being satisfied, or at a later time when the voltage 510-*b* is sufficiently greater than an upper boundary value of the expected threshold voltage interval 525-*b* and the chalcogenide element may no longer be conductive.

FIG. 5C illustrates an example of the random number generator diagram 400 implementing two chalcogenide elements to generate multiple random values, which in some cases maybe combined to form a single multi-bit random number or sequence, with each of the voltage applications, with each of the chalcogenide elements operated on as described with respect to FIG. 4. In random number generator diagram 500-*c*, the voltage source may apply a first voltage 510-*c*-1 to a first chalcogenide element and increase the first voltage 510-*c*-1. The voltage source, or a second voltage source, may apply a second voltage 510-*c*-2 to a second chalcogenide element concurrently with applying the first voltage 510-*c*-1 to the first chalcogenide element, and increase the second voltage 510-*c*-2 concurrently with increasing the first voltage 510-*c*-1. At a first time after increasing the first voltage 510-*c*-1, the first voltage 510-*c*-1 may satisfy a first threshold voltage 520-*c*-1 associated with the first chalcogenide element, at which time the first chalcogenide element may become conductive (e.g., snap). The first threshold voltage 520-*c*-1 may be randomly satisfied at a voltage in an expected threshold voltage interval 525-*c*-1. The latch 505-*c* may detect the state of the oscillating signal 515-*c*-1 at the first time the first threshold voltage 520-*c*-1 is satisfied and output a first logic value corresponding to the state of an oscillating signal 515-*c*-1 at the first time. The voltage source may cease applying the first voltage 510-*c*-1 in response to the first threshold voltage 520-*c*-1 being satisfied, or at a later time when the first voltage 510-*c*-1 is sufficiently greater than an upper boundary value of the expected threshold voltage interval 525-*c*-1 and the first chalcogenide element may no longer be conductive.

Additionally, at a second time after increasing the second voltage 510-*c*-2, the second voltage 510-*c*-2 may satisfy a second threshold voltage 520-*c*-2 associated with the second chalcogenide element, at which time the second chalcogenide element may become conductive (e.g., snap). The second time may be at a same time or a different time as the first time. The second threshold voltage 520-*c*-2 may be randomly satisfied at a voltage in an expected threshold voltage interval 525-*c*-2. In some cases, the latch 505-*c* may detect the state of an oscillating signal 515-*c*-2 at the second time the second threshold voltage 520-*c*-2 is satisfied. In such cases, the latch 505-*c* may output a second logic value corresponding to the state of the oscillating signal 515-*c*-2 at the second time. The oscillating signal 515-*c*-2 may be offset from the oscillating signal 515-*c*-1 in phase, initial timing, amplitude, frequency, or any combination thereof. In other cases, the latch 505-*c* may instead detect the state of the oscillating signal 515-*c*-1 (e.g., when one oscillating signal 515 is present for two chalcogenide elements) at the second time the second threshold voltage 520-*c*-2 is satisfied. In such cases, the latch 505-*c* may output a second logic value corresponding to the state of the oscillating signal 515-*c*-1 at the time. The latch 505-*c* may output a second logic value corresponding to the state of the oscillating signal 515-*c*-1 at the second time. In some cases, a second latch 505-*c* may be coupled with the second chalcogenide element and may instead detect the state of the oscillating signal 515-*c* (e.g., oscillating signal 515-*c*-1, 515-*c*-2) and output the second logic value. The second logic value may be the same or different from the first value. The first logic value and the second logic value may be combined (e.g., by the latch 505-*c*) to form the random number sequence. The voltage source may cease applying the second voltage 510-*c*-2 in response to the second threshold voltage 520-*c*-2 being satisfied, or at a later time when the second voltage 510-*c*-2 is sufficiently greater than an upper boundary value of the expected threshold voltage interval 525-*c*-2 and the second chalcogenide element may no longer be conductive. Additional chalcogenide elements may be used in a similar method as described herein to create additional logic values for the random number sequence.

In some cases, the random number sequence may be a multibit number sequence including many logic values generated using the methods described herein. In some examples, the random number sequence may be generated based on a demand from a host device. For example, the memory device may identify a demand for a particular quantity of logic values (e.g., from a command from the host device) for use at a later time and generate a corresponding set of logic values (e.g., a set of logic values including at least as many logic values as the quantity associated with the demand) prior to the later time. In such example, the set of logic values may be stored to a memory cache associated with the memory device so that they are available (e.g., have already been generated) when used (e.g., requested) at the later time.

In some cases, the memory may implement any combination of the methods described herein at FIGS. 5A-5C to generate a multibit random number sequence. For example, the memory device may implement serial voltage applications (e.g., described in FIG. 5A) in combination with multiple oscillating signals 515 (e.g., described in FIG. 5B) for two chalcogenide elements (e.g., described in FIG. 5C). In such example, the memory device may apply a first voltage 410 and a subsequent second voltage 410 to a first chalcogenide element, and a third voltage 410 and a subsequent fourth voltage 410 to a second chalcogenide element. One or more latches 505-*c* may detect each state of the multiple oscillating signals 515 at a first time the first chalcogenide element snaps (e.g., the threshold voltage is satisfied and chalcogenide element becomes conductive), a second time the first chalcogenide element snaps, a third time the second chalcogenide element snaps, and a fourth time the second chalcogenide element snaps. The one or more latches 505-*c* may output logic values corresponding to these times, such that the logic values may form the multibit random number sequence.

Figure 6:
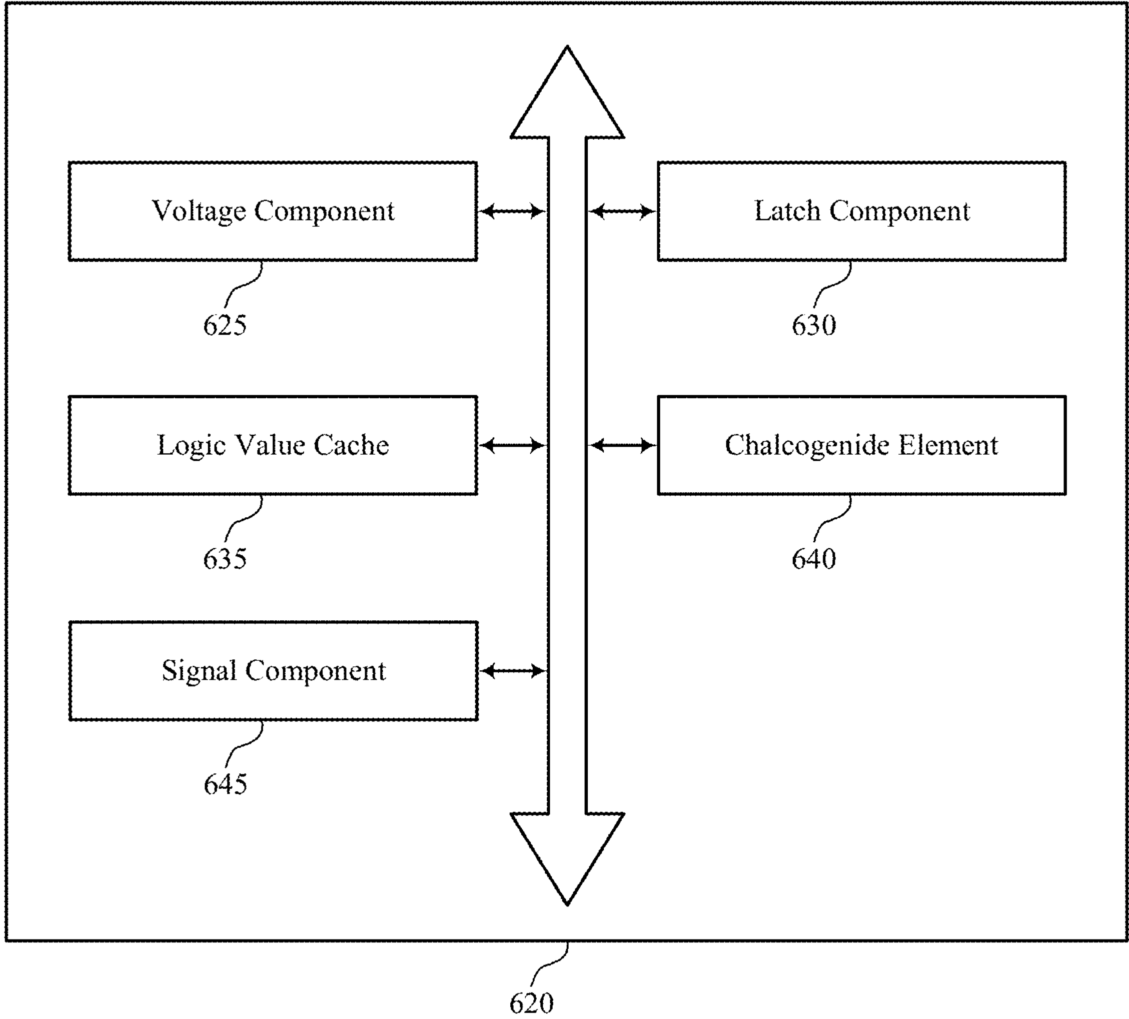
FIG. 6 shows a block diagram of a memory system that supports random number generation based on threshold voltage randomness in accordance with examples as disclosed herein.

FIG. 6 shows a block diagram 600 of a memory system 620 that supports random number generation based on threshold voltage randomness in accordance with examples as disclosed herein. The memory system 620 may be an example of aspects of a memory system as described with reference to FIGS. 1 through 5. The memory system 620, or various components thereof, may be an example of means for performing various aspects of random number generation based on threshold voltage randomness as described herein. For example, the memory system 620 may include a voltage component 625, a latch component 630, a logic value cache 635, a chalcogenide element 640, a signal component 645, or any combination thereof. Each of these components may communicate, directly or indirectly, with one another (e.g., via one or more buses).

The voltage component 625 may be configured as or otherwise support a means for applying a voltage to the chalcogenide element 640 of a memory system. In some examples, the voltage component 625 may be configured as or otherwise support a means for increasing the applied voltage at least until the applied voltage satisfies a threshold voltage associated with the chalcogenide element 640. The latch component 630 may be configured as or otherwise support a means for detecting a time at which the applied voltage satisfies the threshold voltage associated with the chalcogenide element 640. In some examples, the latch component 630 may be configured as or otherwise support a means for detecting a state of an oscillating signal (which may be generated by the signal component 645), as of the time at which the applied voltage satisfies the threshold voltage. In some examples, the latch component 630 may be configured as or otherwise support a means for outputting a logic value based at least in part on the state of the oscillating signal as of the time at which the applied voltage satisfies the threshold voltage.

In some examples, the voltage component 625 may be configured as or otherwise support a means for ceasing application of the voltage to the chalcogenide element 640 of the memory system based at least in part on the applied voltage satisfying the threshold voltage associated with the chalcogenide element 640.

In some examples, the voltage component 625 may be configured as or otherwise support a means for applying a second voltage to the chalcogenide element 640 of the memory system after ceasing application of the voltage. In some examples, the voltage component 625 may be configured as or otherwise support a means for increasing the applied second voltage at least until the applied second voltage satisfies a second threshold voltage associated with the chalcogenide element 640. In some examples, the latch component 630 may be configured as or otherwise support a means for detecting a second time at which the applied voltage satisfies the second threshold voltage associated with the chalcogenide element 640. In some examples, the latch component 630 may be configured as or otherwise support a means for detecting a second state of an oscillating signal as of the second time at which the applied second voltage satisfies the second threshold voltage. In some examples, the latch component 630 may be configured as or otherwise support a means for outputting a second logic value based at least in part on the second state of the oscillating signal as of the second time at which the applied second voltage satisfies the second threshold voltage.

In some examples, the latch component 630 may be configured as or otherwise support a means for generating a multibit number sequence using the logic value and the second logic value.

In some examples, the second threshold voltage is different from the threshold voltage based on random variation associated with the chalcogenide element 640.

In some examples, the latch component 630 may be configured as or otherwise support a means for detecting a second state of a second oscillating signal, generated by the signal component 645, as of the time at which the applied voltage satisfies the threshold voltage. In some examples, the latch component 630 may be configured as or otherwise support a means for outputting a second logic value based at least in part on the second state of the second oscillating signal as of the time at which the applied voltage satisfies the threshold voltage. In some examples, the latch component 630 may be configured as or otherwise support a means for generating a multibit number sequence using the logic value and the second logic value.

In some examples, the signal component 645 may generate the oscillating signals such that the second oscillating signal is offset from the oscillating signal in phase, time, frequency, or any combination thereof.

In some examples, the voltage component 625 may be configured as or otherwise support a means for applying a second voltage to a second chalcogenide element 640 of the memory system. In some examples, the voltage component 625 may be configured as or otherwise support a means for increasing the applied second voltage at least until the applied second voltage satisfies a second threshold voltage associated with the second chalcogenide element 640, the increasing of the applied second voltage at least partially concurrent with the increasing of the applied voltage. In some examples, the latch component 630 may be configured as or otherwise support a means for detecting a second time at which the applied second voltage satisfies the second threshold voltage associated with the second chalcogenide element 640. In some examples, the latch component 630 may be configured as or otherwise support a means for detecting a second state of an oscillating signal as of the second time at which the applied second voltage satisfies the second threshold voltage. In some examples, the latch component 630 may be configured as or otherwise support a means for outputting a second logic value based at least in part on the second state of the oscillating signal as of the second time at which the applied second voltage satisfies the second threshold voltage. In some examples, the latch component 630 may be configured as or otherwise support a means for generating a multibit number sequence using the logic value and the second logic value.

In some examples, the threshold voltage is within a threshold voltage range associated with the chalcogenide element 640, and the oscillating signal changes between a high state and a low state a plurality of times while the applied voltage is within the threshold voltage range.

In some examples, the latch component 630 may be configured as or otherwise support a means for identifying, at a first time, a quantity of logic values for use at a second time later than the first time, where the logic value includes one of a set of logic values for use at the second time, the set of logic values comprising the identified quantity of logic values. In some examples, the logic value cache 635 may be configured as or otherwise support a means for storing, prior to the second time, the set of logic values within the memory system for use at the second time.

In some examples, the oscillating signal generated by the signal component 645 may have an unbalanced duty cycle.

Figure 7:
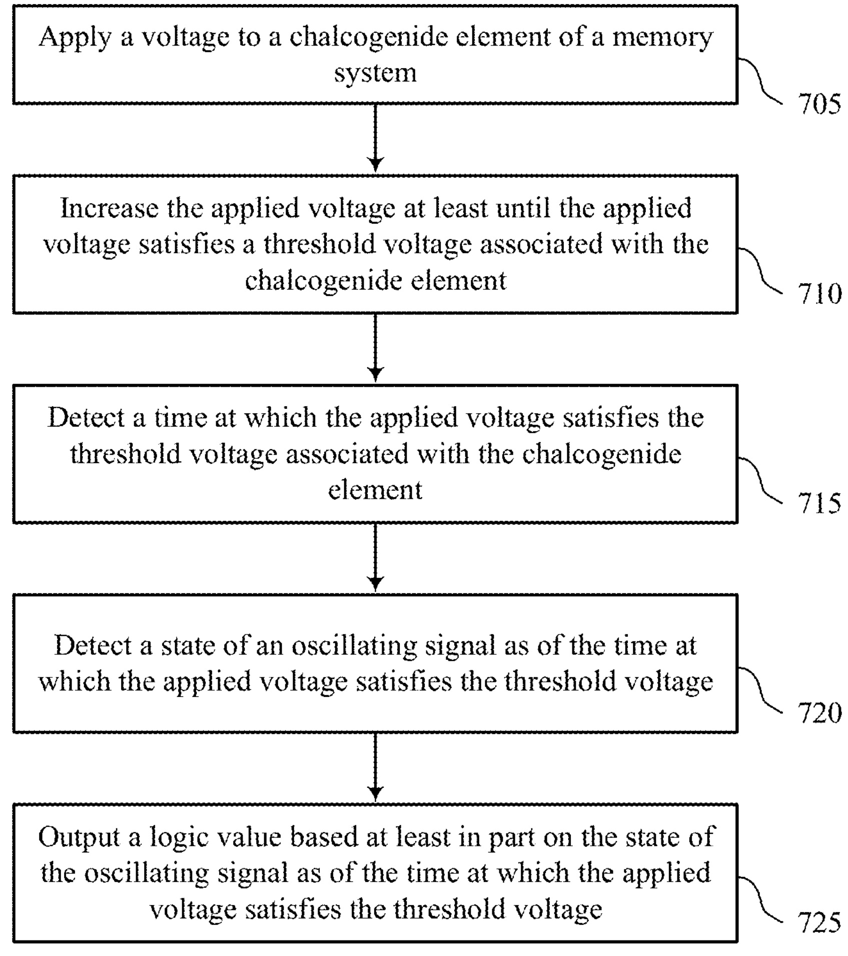
FIG. 7 shows a flowchart illustrating a method or methods that support random number generation based on threshold voltage randomness in accordance with examples as disclosed herein.

FIG. 7 shows a flowchart illustrating a method 700 that supports random number generation based on threshold voltage randomness in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 705, the method may include applying a voltage to a chalcogenide element of a memory system. The operations of 705 may be performed in accordance with examples as disclosed herein. In some examples, aspects of the operations of 705 may be performed by a voltage component 625 as described with reference to FIG. 6.

At 710, the method may include increasing the applied voltage at least until the applied voltage satisfies a threshold voltage associated with the chalcogenide element. The operations of 710 may be performed in accordance with examples as disclosed herein. In some examples, aspects of the operations of 710 may be performed by a voltage component 625 as described with reference to FIG. 6.

At 715, the method may include detecting a time at which the applied voltage satisfies the threshold voltage associated with the chalcogenide element. The operations of 715 may be performed in accordance with examples as disclosed herein. In some examples, aspects of the operations of 715 may be performed by a latch component 630 as described with reference to FIG. 6.

At 720, the method may include detecting a state of an oscillating signal as of the time at which the applied voltage satisfies the threshold voltage. The operations of 720 may be performed in accordance with examples as disclosed herein. In some examples, aspects of the operations of 720 may be performed by a latch component 630 as described with reference to FIG. 6.

At 725, the method may include outputting a logic value based at least in part on the state of the oscillating signal as of the time at which the applied voltage satisfies the threshold voltage. The operations of 725 may be performed in accordance with examples as disclosed herein. In some examples, aspects of the operations of 725 may be performed by a latch component 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying a voltage to a chalcogenide element of a memory system; increasing the applied voltage at least until the applied voltage satisfies a threshold voltage associated with the chalcogenide element; detecting a time at which the applied voltage satisfies the threshold voltage associated with the chalcogenide element; detecting a state of an oscillating signal as of the time at which the applied voltage satisfies the threshold voltage; and outputting a logic value based at least in part on the state of the oscillating signal as of the time at which the applied voltage satisfies the threshold voltage.

Aspect 2: The method, apparatus, or non-transitory computer-readable medium of aspect 1, further including operations, features, circuitry, logic, means, or instructions, or any combination thereof for ceasing application of the voltage to the chalcogenide element of the memory system based at least in part on the applied voltage satisfying the threshold voltage associated with the chalcogenide element.

Aspect 3: The method, apparatus, or non-transitory computer-readable medium of aspect 2, further including operations, features, circuitry, logic, means, or instructions, or any combination thereof for applying a second voltage to the chalcogenide element of the memory system after ceasing application of the voltage; increasing the applied second voltage at least until the applied second voltage satisfies a second threshold voltage associated with the chalcogenide element; detecting a second time at which the applied voltage satisfies the second threshold voltage associated with the chalcogenide element; detecting a second state of an oscillating signal as of the second time at which the applied second voltage satisfies the second threshold voltage; and outputting a second logic value based at least in part on the second state of the oscillating signal as of the second time at which the applied second voltage satisfies the second threshold voltage.

Aspect 4: The method, apparatus, or non-transitory computer-readable medium of aspect 3, further including operations, features, circuitry, logic, means, or instructions, or any combination thereof for generating a multibit number sequence using the logic value and the second logic value.

Aspect 5: The method, apparatus, or non-transitory computer-readable medium of any of aspects 3 through 4, where the second threshold voltage is different from the threshold voltage based on random variation associated with the chalcogenide element.

Aspect 6: The method, apparatus, or non-transitory computer-readable medium of any of aspects 1 through 5, further including operations, features, circuitry, logic, means, or instructions, or any combination thereof for detecting a second state of a second oscillating signal as of the time at which the applied voltage satisfies the threshold voltage; outputting a second logic value based at least in part on the second state of the second oscillating signal as of the time at which the applied voltage satisfies the threshold voltage; and generating a multibit number sequence using the logic value and the second logic value.

Aspect 7: The method, apparatus, or non-transitory computer-readable medium of aspect 6, where the second oscillating signal is offset from the oscillating signal in phase, time, frequency, or any combination thereof.

Aspect 8: The method, apparatus, or non-transitory computer-readable medium of any of aspects 1 through 7, further including operations, features, circuitry, logic, means, or instructions, or any combination thereof for applying a second voltage to a second chalcogenide element of the memory system; increasing the applied second voltage at least until the applied second voltage satisfies a second threshold voltage associated with the second chalcogenide element, the increasing of the applied second voltage at least partially concurrent with the increasing of the applied voltage; detecting a second time at which the applied second voltage satisfies the second threshold voltage associated with the second chalcogenide element; detecting a second state of an oscillating signal as of the second time at which the applied second voltage satisfies the second threshold voltage; outputting a second logic value based at least in part on the second state of the oscillating signal as of the second time at which the applied second voltage satisfies the second threshold voltage; and generating a multibit number sequence using the logic value and the second logic value.

Aspect 9: The method, apparatus, or non-transitory computer-readable medium of any of aspects 1 through 8, where the threshold voltage is within a threshold voltage range associated with the chalcogenide element, and the oscillating signal changes between a high state and a low state a plurality of times while the applied voltage is within the threshold voltage range.

Aspect 10: The method, apparatus, or non-transitory computer-readable medium of any of aspects 1 through 9, further including operations, features, circuitry, logic, means, or instructions, or any combination thereof for identifying, at a first time, a quantity of logic values for use at a second time later than the first time, where the logic value includes one of the quantity of logic values for use at the second time and storing, prior to the second time, the quantity of logic values within the memory system for use at the second time.

Aspect 11: The method, apparatus, or non-transitory computer-readable medium of any of aspects 1 through 10, where the oscillating signal has an unbalanced duty cycle.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 12: An apparatus, including: a chalcogenide element of a memory system; a voltage component configured to apply a voltage to the chalcogenide element at least until the applied voltage satisfies a threshold voltage associated with the chalcogenide element; a signal component configured to generate an oscillating signal; and a latch component configured to: detect a time at which the applied voltage satisfies the threshold voltage associated with the chalcogenide element; detect a state of the oscillating signal as of the time at which the applied voltage satisfies the threshold voltage; and output a logic value based at least in part on the state of the oscillating signal as of the time at which the applied voltage satisfies the threshold voltage.

Aspect 13: The apparatus of aspect 12, where the voltage component is further configured to cease applying the voltage to the chalcogenide element based at least in part on the applied voltage satisfying the threshold voltage associated with the chalcogenide element.

Aspect 14: The apparatus of aspect 13, where: the voltage component is further configured to apply a second voltage to the chalcogenide element and increase the applied second voltage at least until the applied second voltage satisfies a second threshold voltage associated with the chalcogenide element; and the latch component is further configured to output a second logic value based at least in part on detecting a second state of the oscillating signal as of a second time at which the applied second voltage satisfies the second threshold voltage.

Aspect 15: The apparatus of aspect 14, where the latch component is further configured to generate a multibit number sequence using the logic value and the second logic value.

Aspect 16: The apparatus of any of aspects 12 through 15, where: the signal component is further configured to generate a plurality of oscillating signals; and the latch component is further configured to output a plurality of logic values based at least in part on detecting a respective state of each of the plurality of oscillating signals as of the time at which the applied voltage satisfies the threshold voltage and to generate a multibit number sequence using the plurality of logic values.

Aspect 17: The apparatus of aspect 16, where each oscillating signal of the plurality of oscillating signals is offset in phase or time from each other oscillating signal of the plurality of oscillating signals.

Aspect 18: The apparatus of any of aspects 12 through 17, further including: a second chalcogenide element of the memory system, where: the voltage component is further configured to apply the second voltage to the second chalcogenide element at least until the applied second voltage satisfies a second threshold voltage associated with the second chalcogenide element; and the latch component is further configured to: detect a second time at which the applied second voltage satisfies the second threshold voltage associated with the chalcogenide element; detect a second state of the oscillating signal as of the second time at which the applied second voltage satisfies the second threshold voltage; output a second logic value based at least in part on the second state of the oscillating signal as of the second time at which the applied second voltage satisfies the second threshold voltage; and generate a multibit number sequence using the logic value and the second logic value.

Aspect 19: The apparatus of any of aspects 12 through 18, where the threshold voltage is within a threshold voltage range associated with the chalcogenide element, and the oscillating signal is configured to change between a high state and a low state a plurality of times while the applied voltage is within the threshold voltage range.

Aspect 20: The apparatus of any of aspects 12 through 19, where the chalcogenide element is configured for the threshold voltage to exhibit a random variation across different voltage applications.

An apparatus is described. The following provides an overview of aspects of the apparatus as described herein:

Aspect 21: An apparatus, including: a chalcogenide element; a controller configured to cause the apparatus to increase a voltage applied to the chalcogenide element at least until the voltage satisfies a threshold voltage associated with the chalcogenide element; and a latch component configured to output a logic value based at least in part on a state of an oscillating signal as of a time at which the applied voltage satisfies the threshold voltage.

Aspect 22: The apparatus of aspect 21, where: the controller is further configured to cause the apparatus to, after ceasing application of the voltage to the chalcogenide element, increase a second voltage applied to the chalcogenide element at least until the second voltage satisfies a second threshold voltage associated with the chalcogenide element; the latch component is further configured to output a second logic value based at least in part on a second state of the oscillating signal as of a second time at which the second voltage satisfies the second threshold voltage; and the apparatus further includes a sequence component configured to generate a multibit number sequence using the logic value and the second logic value.

Aspect 23: The apparatus of any of aspects 21 through 22, further including: a second latch component configured to output a second logic value based at least in part on a second state of a second oscillating signal as of the time at which the voltage satisfies the threshold voltage; and a sequence component configured to generate a multibit number sequence using the logic value and the second logic value.

Aspect 24: The apparatus of any of aspects 21 through 23, further including: a second chalcogenide element, where the controller is further configured to cause the apparatus to increase a second voltage applied to the second chalcogenide element at least until the second voltage satisfies a second threshold voltage associated with the chalcogenide element; a second latch component configured to output a second logic value based at least in part on a second state of a second oscillating signal as of a second time at which the second voltage satisfies the second threshold voltage; and a sequence component configured to generate a multibit number sequence using the logic value and the second logic value.

Aspect 25: The apparatus of any of aspects 21 through 24, further including: a detection component configured to detect the time at which the applied voltage satisfies the threshold voltage based at least in part on a magnitude of a current associated with the chalcogenide element.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms “electronic communication,” “conductive contact,” “connected,” and “coupled” may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

increasing a voltage applied to a chalcogenide element of a memory system at least until the voltage satisfies a threshold voltage;

identifying a state of an oscillating signal corresponding to a time at which the voltage satisfies the threshold voltage; and outputting a logic value corresponding to the state of the oscillating signal.

2. The method of claim 1, further comprising:

ceasing application of the voltage to the chalcogenide element based at least in part on the voltage satisfying the threshold voltage.

3. The method of claim 2, further comprising:

increasing, based at least in part on ceasing application of the voltage, a second voltage applied to the chalcogenide element of the memory system at least until the second voltage satisfies a second threshold voltage;

identifying a second state of the oscillating signal corresponding to a second time at which the second voltage satisfies the second threshold voltage; and outputting a second logic value corresponding to the second state of the oscillating signal.

4. The method of claim 3, further comprising:

generating a number sequence using the logic value and the second logic value.

5. The method of claim 3, wherein the second threshold voltage is different from the threshold voltage.

6. The method of claim 1, further comprising:

identifying a second state of a second oscillating signal corresponding to the time at which the voltage satisfies the threshold voltage;

outputting a second logic value corresponding to the second state of the second oscillating signal; and generating a number sequence using the logic value and the second logic value.

7. The method of claim 6, wherein the second oscillating signal is offset from the oscillating signal in phase, time, frequency, or any combination thereof.

8. The method of claim 1, further comprising:

increasing, at least partially concurrently with increasing the voltage, a second voltage applied to a second chalcogenide element of the memory system at least until the second voltage satisfies a second threshold voltage;

identifying a second state of the oscillating signal corresponding to a second time at which the second voltage satisfies the second threshold voltage;

outputting a second logic value corresponding to the second state of the oscillating signal; and generating a number sequence using the logic value and the second logic value.

9. The method of claim 1, wherein the threshold voltage is within a threshold voltage range associated with the chalcogenide element, and wherein the oscillating signal changes between a high state and a low state at least once while the voltage is within the threshold voltage range.

10. The method of claim 1, further comprising:

storing the logic value within the memory system.

11. The method of claim 1, wherein the oscillating signal has an unbalanced duty cycle.

12. An apparatus, comprising:

a chalcogenide element of a memory system;

a voltage component configured to increase a voltage applied to the chalcogenide element at least until the voltage satisfies a threshold voltage;

a signal component configured to generate an oscillating signal; and a latch component configured to:

identify a state of the oscillating signal corresponding to a time at which the voltage satisfies the threshold voltage; and output a logic value corresponding to the state of the oscillating signal.

13. The apparatus of claim 12, wherein the voltage component is further configured to cease application of the voltage applied to the chalcogenide element based at least in part on the voltage satisfying the threshold voltage.

14. The apparatus of claim 13, wherein:

the voltage component is further configured to increase, based at least in part on ceasing application of the voltage, a second voltage applied to the chalcogenide element at least until the second voltage satisfies a second threshold voltage; and the latch component is further configured to output a second logic value corresponding to a second state of the oscillating signal corresponding to a second time at which the second voltage satisfies the second threshold voltage.

15. The apparatus of claim 14, wherein the latch component is further configured to generate a number sequence using the logic value and the second logic value.

16. The apparatus of claim 12, wherein:

the signal component is further configured to generate a plurality of oscillating signals; and the latch component is further configured to output a plurality of logic values corresponding to respective states of each of the plurality of oscillating signals corresponding to the time at which the voltage satisfies the threshold voltage and to generate a number sequence using the plurality of logic values.

17. The apparatus of claim 16, wherein each oscillating signal of the plurality of oscillating signals is offset in phase, time, frequency, or any combination thereof from each other oscillating signal of the plurality of oscillating signals.

18. The apparatus of claim 12, further comprising:

a second chalcogenide element of the memory system, wherein:

the voltage component is further configured to increase a second voltage applied to the second chalcogenide element at least until the second voltage satisfies a second threshold voltage; and the latch component is further configured to:

identify a second state of the oscillating signal corresponding to a second time at which the second voltage satisfies the second threshold voltage;

output a second logic value corresponding to the second state of the oscillating signal; and generate a number sequence using the logic value and the second logic value.

19. The apparatus of claim 12, wherein the threshold voltage is within a threshold voltage range associated with the chalcogenide element, and wherein the oscillating signal is configured to change between a high state and a low state at least once while the voltage is within the threshold voltage range.

20. An apparatus, comprising:

a chalcogenide element;

one or more processors configured to cause a memory system to increase a voltage applied to the chalcogenide element at least until the voltage satisfies a threshold voltage; and a latch component configured to output a logic value corresponding to a state of an oscillating signal corresponding to a time at which the voltage satisfies the threshold voltage.

* * * * *